US008889446B2

(12) United States Patent
Yang et al.

(10) Patent No.: US 8,889,446 B2
(45) Date of Patent: Nov. 18, 2014

(54) POLYSILICON THIN FILM TRANSISTOR DEVICE AND METHOD OF FABRICATING THE SAME

(75) Inventors: Myoung Su Yang, Gyeonggi-do (KR); Kum Mi Oh, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 138 days.

(21) Appl. No.: 13/419,855

(22) Filed: Mar. 14, 2012

(65) Prior Publication Data

US 2012/0171794 A1 Jul. 5, 2012

Related U.S. Application Data

(60) Division of application No. 11/812,182, filed on Jun. 15, 2007, now Pat. No. 8,158,982, which is a continuation of application No. 10/842,545, filed on May 11, 2004, now abandoned.

(30) Foreign Application Priority Data

Sep. 23, 2003 (KR) .......................... 10-2003-0065813

(51) Int. Cl.
*H01L 33/08* (2010.01)
*H01L 29/423* (2006.01)
*H01L 29/66* (2006.01)
*H01L 29/786* (2006.01)

(52) U.S. Cl.
CPC .... *H01L 29/66765* (2013.01); *H01L 29/42384* (2013.01); *H01L 29/78678* (2013.01)

USPC .................................. 438/34; 257/57; 257/59

(58) Field of Classification Search
USPC ............................................................ 438/34
See application file for complete search history.

(56) References Cited

U.S. PATENT DOCUMENTS

| 6,339,230 | B1 * | 1/2002 | Lee et al. .......................... 257/88 |
| 6,441,348 | B1 * | 8/2002 | Yang et al. ..................... 219/439 |
| 6,476,416 | B1 * | 11/2002 | Ikeda ................................ 257/59 |
| 6,534,246 | B2 * | 3/2003 | Bae ................................ 430/318 |
| 2002/0025591 | A1 * | 2/2002 | Ohnuma et al. ................ 438/30 |

FOREIGN PATENT DOCUMENTS

| KR | 20010062476 | 7/2001 |
| KR | 20020091456 | 12/2002 |

* cited by examiner

*Primary Examiner* — Kenneth Parker
*Assistant Examiner* — Christopher Culbert
(74) *Attorney, Agent, or Firm* — Morgan, Lewis & Bockius LLP (57) ABSTRACT

A polysilicon thin film transistor device includes a gate metal pattern including a gate electrode and a gate line formed on a substrate, the gate metal pattern having a stepped portion, a gate insulating film formed on the gate metal pattern, a polysilicon semiconductor layer formed on the gate insulating film, the polysilicon semiconductor layer including an active region, lightly doped drain regions, a source region, and a drain region, a source electrode connected to the source region and a drain electrode connected to the drain region on the polysilicon semiconductor layer, and a pixel electrode connected with the drain electrode.

6 Claims, 12 Drawing Sheets

POLYSILICON THIN FILM TRANSISTOR DEVICE AND METHOD OF FABRICATING THE SAME

This application is a divisional application of Application No. 11/812,182, filed Jun. 15, 2007 now U.S. Pat. No. 8,158,982, which is a continuation of U.S. patent application Ser. No. 10/842,545, now abandoned, both of which are hereby incorporated by reference. The present invention also claims the benefit of Korean Patent Application No. 65813/2003 filed in Korea on Sep. 23, 2003, all of which are hereby incorporated by reference.

BACKGROUND OF THE INVENTION

1. Field of the Invention

The present invention relates to a polysilicon thin film transistor device and a method of fabricating a polysilicon thin film transistor device, and more particularly, to a bottom-gated silicon thin film transistor device and a method of fabricating a bottom-gated silicon thin film transistor device.

2. Description of the Related Art

As demand increases for flat panel displays having slim profiles, light weight, and low power consumption, development of new liquid crystal display (LCD) devices having superior color reproduction has increased. In general, LCD devices include two substrates facing each other, wherein electrodes are formed on facing surfaces of the substrates, and a liquid crystal material is injected into a space defined between the substrates. Accordingly, the LCD device displays images by changing alignment of liquid crystal molecules within the liquid crystal material by an electric field generated by voltages applied to the electrodes in order to vary a light transmittance of the liquid crystal material.

Among the different types of LCD devices, active matrix LCD (AM-LCD) devices are being developed due to their high image resolution and superior ability to display moving images. In the AM-LCD device, pixel electrodes are formed on a lower thin film transistor (TFT) array substrate, and a common electrode is formed on an upper color filter substrate. By controlling voltages applied between the pixel electrodes and the common electrode, liquid crystal molecules of the AM-LCD are driven. Accordingly, the AM-LCD device has superior light transmittance and aperture ratio characteristics. In addition, since the common electrode of the AM-LCD device functions as a ground, failure of LC cells of the AM-LCD device to electrostatic discharge is prevented. The TFTs used in the AM-LCD device are classified as one of amorphous silicon TFTs and a polycrystalline silicon (i.e., polysilicon) TFTs depending on whether an active channel region functions using amorphous silicon or polysilicon.

The amorphous TFT is commonly used because it enables fabrication of large-sized displays, thereby resulting in high productivity. In addition, fabrication of the amorphous TFT includes low temperature deposition of the amorphous silicon at temperatures less than 350° C., and uses low priced insulator substrates. However, due to disordered atomic arrangement, weak Si—Si bonds, and dangling bonds of the amorphous silicon, hydrogenized amorphous silicon (a:Si—H) is used. But, a:Si—H becomes a metastable state when exposed to light or an electric field is applied, thereby causing instability. For example, when light is irradiated onto a:Si—H, field mobility and reliability deteriorate, thereby making it difficult to use amorphous silicon in driving circuitry of an LCD device. In addition, as resolution of an LCD panel of the LCD devices increases, pitch of contact pads used for connecting gate lines and data lines with a tape carrier package (TCP) decreases, thereby causing problems using TCP bonding processes.

Meanwhile, since the polysilicon TFT has a field mobility higher than that of the amorphous TFT, driving circuitry can be made directly onto a substrate, thereby reducing manufacturing costs for fabricating the driving circuitry and simplifying mounting processes. In addition, since field mobility of the polysilicon TFTs are 100 to 200 times greater than the field mobility of the amorphous silicon TFTs, the polysilicon TFTS have fast response times and superior stability against temperature and light. Moreover, the polysilicon TFTs have an advantage in that the driving circuitry may be formed on an identical substrate together with other device elements.

Figure 1:
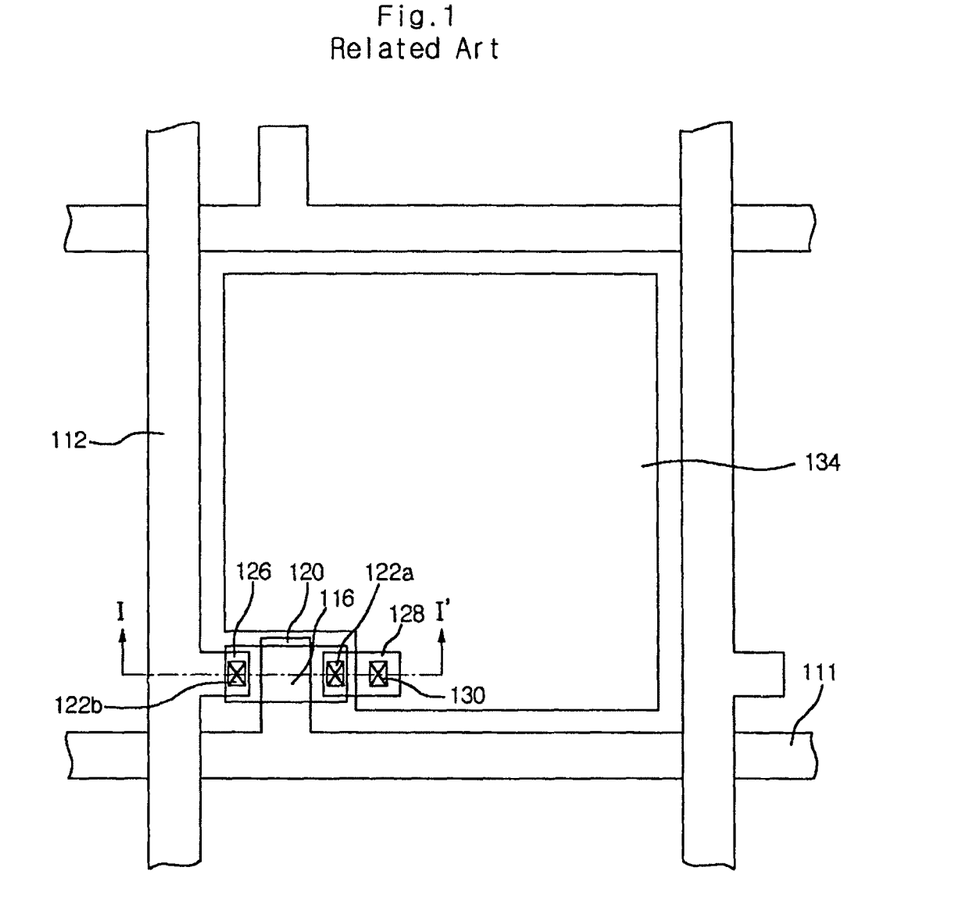
FIG. 1 is a plan view of a pixel region of an LCD device according to the related art.

FIG. 1 is a plan view of a pixel region of an LCD device according to the related art. In FIG. 1, a plurality of parallel gate lines 111 and a plurality of parallel data lines 112 are arranged on a transparent substrate in a matrix configuration, thereby defining a plurality of pixel regions. A TFT including a semiconductor layer 116, a gate electrode 120, a source electrode 126, and a drain electrode 128 is formed at each crossing point of the gate and data lines 111 and 112, and a pixel electrode 134 electrically connected with the TFT is disposed within one of the pixel regions defined by the gate and data lines 111 and 112. The source electrode 126 and the drain electrode 128 electrically contact the semiconductor layer 116 through first and second contact holes 122a and 122b, and the drain electrode 128 electrically contacts the pixel electrode 134 through a contact hole 130. The semiconductor layer 116 is composed of polysilicon (p-Si), which is formed by depositing an amorphous silicon (a-Si) film on the substrate and annealing the deposited amorphous silicon film using a laser.

Figure 2:
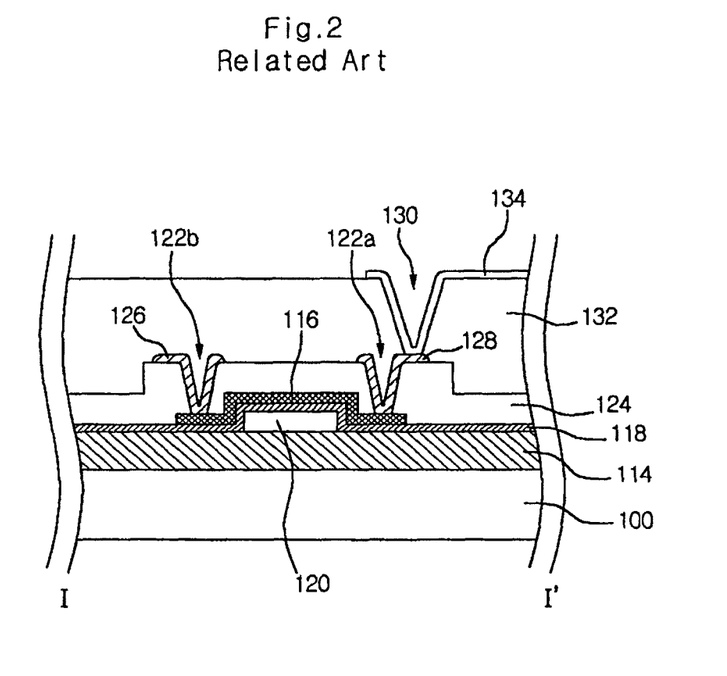
FIG. 2 is a cross sectional view along I-I' of FIG. 1 according to the related art.

FIG. 2 is a cross sectional view along I-I' of FIG. 1 according to the related art. In FIG. 2, a buffer layer 114 is formed along an entire surface of the substrate 100, and the gate electrode 120 is formed on the buffer layer 114. Then, a gate insulating film 118 is formed on the gate electrode 120 and the buffer layer 114, and a semiconductor layer 116 is formed on the gate insulating film 118.

Next, an interlayer insulating film 124 is formed to cover the semiconductor layer 116, and includes first and second contact holes 122a and 122b. Then, the source and drain electrodes 126 and 128 are formed on the interlayer insulating film 124 and within the first and second contact holes 122a and 122b, thereby connecting the source and drain electrodes 126 and 128 with the semiconductor layer 116 through the first and second contact holes 122a and 122b.

Then, a passivation layer 132 having a drain contact hole 130 is formed on the source and drain electrodes 126 and 128 and the interlayer insulating film 124. Next, a pixel electrode 134 is formed on the passivation layer 132 and in the drain contact hole, and is connected to the drain electrode 128 through the drain contact hole 130.

In FIGS. 1 and 2, the gate electrode 120 and a gate line 111 are formed of the same metal material. However, the gate electrode 120 and the gate line 111 have a height difference that may result in creating an open circuit condition of the gate line during crystallization of the amorphous silicon.

Figure 3:
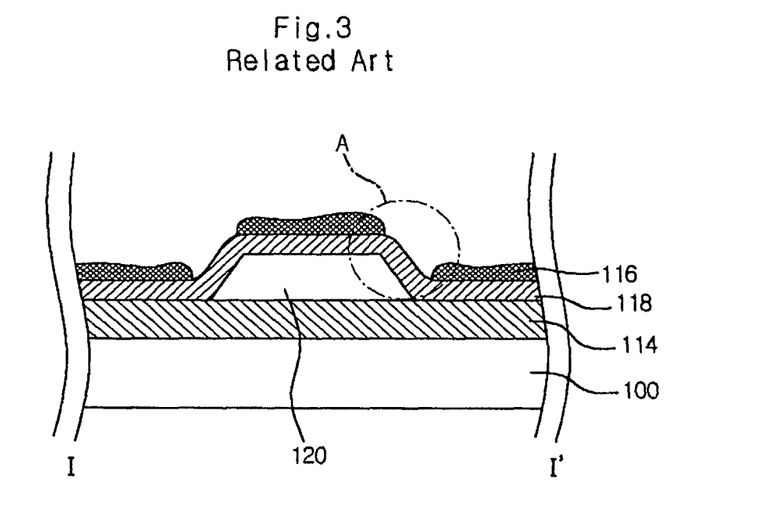
FIG. 3 is a cross sectional view of a crystallization process according to the related art.

FIG. 3 is a cross sectional view of a crystallization process according to the related art. In FIG. 3, the amorphous silicon film 116 is formed along an entire surface of the substrate 100 to a thickness of 300~4,000 Å by a plasma enhanced chemical vapor deposition (PECVD) method. Then, the amorphous silicon film 116 undergoes a hydrogen evolution at 400~500° C. The hydrogen evolution is performed to remove hydrogen added during the deposition of the amorphous silicon film 120a, thereby preventing film ablation phenomenon during a subsequent laser annealing process. Then, the hydrogen evolution-treated amorphous silicon film 116 is annealed using a laser, and is crystallized.

In FIGS. 2 and 3, if a thickness of the gate electrode 120 is large, an open circuit condition may be created during the laser annealing process of the amorphous silicon film 116 at a stepped portion "A." This is due to agglomeration of silicon atoms of the amorphous silicon film due to curvature of the stepped portion "A" while the amorphous silicon film is crystallized. Accordingly, the thickness of the gate electrode 120 must be appropriately thin. However, if the thickness of the gate electrode is too thin, data transmission (i.e., line delay) may be caused due to an increase in electrical resistance of the gate line while the gate line and the gate electrode are driven.

SUMMARY OF THE INVENTION

Accordingly, the present invention is directed to a polysilicon thin film transistor device and a method of fabricating a polysilicon thin film transistor device that substantially obviate one or more problems due to limitations and disadvantages of the related art.

An object of the present invention is to provide a polysilicon thin film transistor device having good crystallization.

Another object of the present invention is to provide a method of fabricating a polysilicon thin film transistor device having good crystallization.

Additional features and objects of the invention will be set forth in part in the description which follows, and in part will be apparent from the description, or may be learned from practice of the invention. The objectives and other advantages of the invention will be realized and attained by the structure particularly pointed out in the written description and claims hereof as well as the appended drawings.

To achieve these objects and other advantages and in accordance with the purpose of the invention, as embodied and broadly described, a polysilicon thin film transistor device includes a gate metal pattern including a gate electrode and a gate line formed on a substrate, the gate metal pattern having a stepped portion, a gate insulating film formed on the gate metal pattern, a polysilicon semiconductor layer formed on the gate insulating film, the polysilicon semiconductor layer including an active region, lightly doped drain regions, a source region, and a drain region, a source electrode connected to the source region and a drain electrode connected to the drain region on the polysilicon semiconductor layer, and a pixel electrode connected with the drain electrode.

In another aspect, a method of fabricating a polysilicon thin film transistor device includes forming a gate metal pattern having a stepped portion on a substrate, forming a gate insulating film on the gate metal pattern, forming a polysilicon semiconductor layer on the gate insulating film, forming an active region, lightly doped drain regions, a source region, and a drain region on the polysilicon semiconductor layer by implanting impurities, forming a source electrode electrically connected to the source region and forming a drain electrode electrically connected to the drain region, and forming a pixel electrode connected to the drain electrode.

In another aspect, a method of fabricating a polysilicon thin film transistor device includes forming a gate metal material on a substrate, forming a photoresist film pattern having a stepped portion by coating a photoresist film on the gate metal material and diffraction-exposing the coated photoresist film, patterning a gate electrode and a gate line by a first etching of the gate metal material exposed by the photoresist film pattern, performing a second etching of the gate electrode such that the gate electrode and the gate line have a thickness difference, forming a gate insulating film on the gate metal pattern, forming a polysilicon layer on the gate insulating film, forming a source electrode electrically connected to a source region of the polysilicon layer and forming a drain electrode electrically connected to a drain region on the polysilicon layer, and forming a pixel electrode connected to the drain electrode.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings; which are included to provide a further understanding of the invention and are incorporated in and constitute a part of this application, illustrate embodiments of the invention and together with the description serve to explain the principle of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 4:
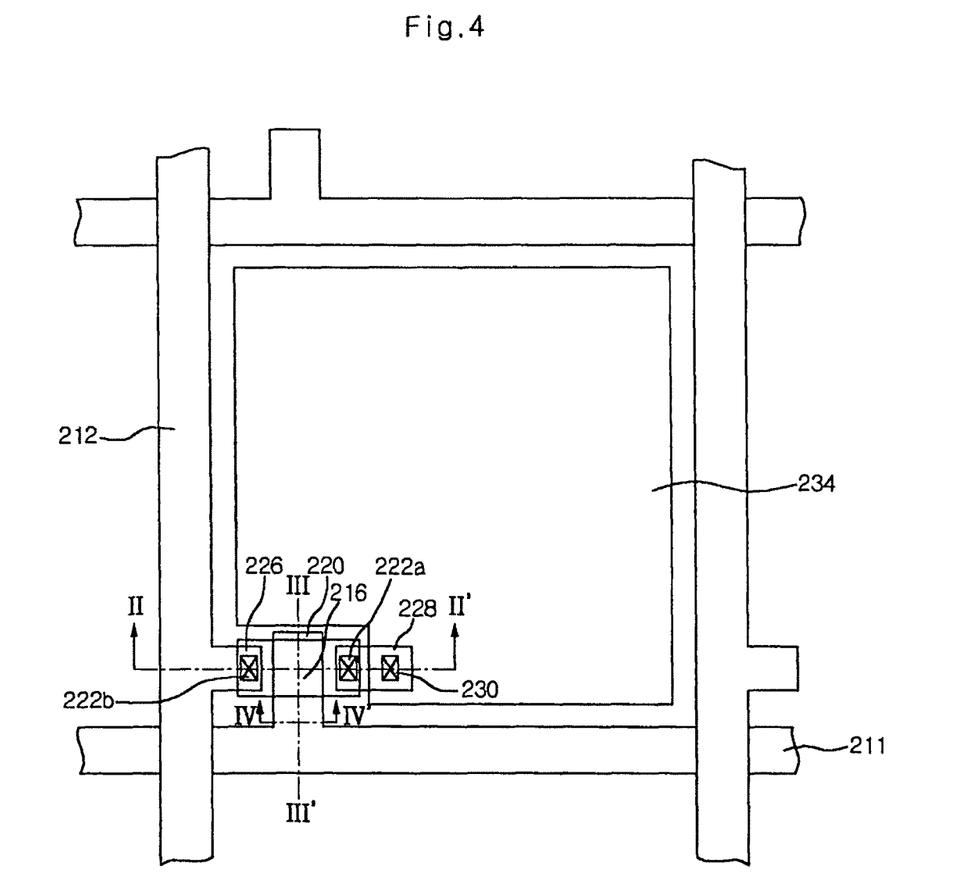
FIG. 4 is a plan view of an exemplary array substrate including a thin film transistor structure according to the present invention.
Figure 5A:
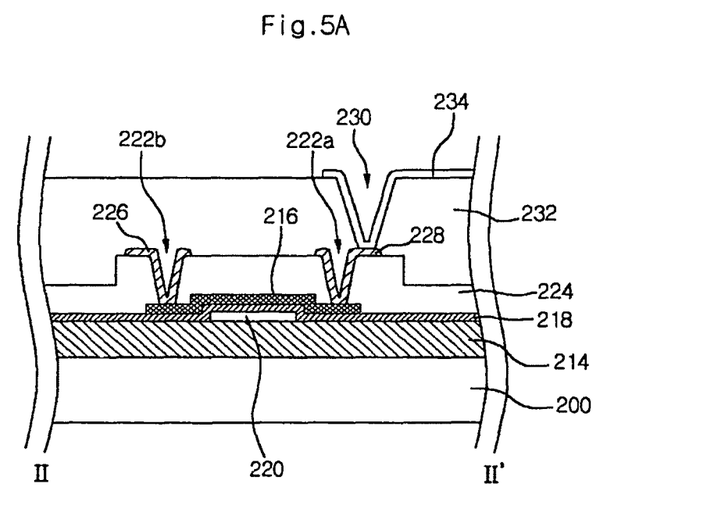
FIGS. 5A and 5B are cross sectional views along II-II' and III-III' of FIG. 4 according to the present invention.
Figure 5B:
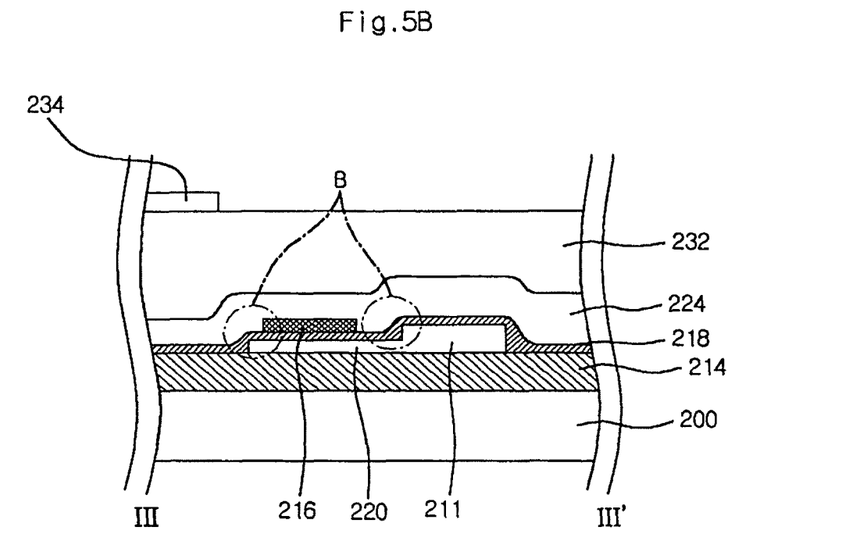

FIG. 4 is a plan view of an exemplary array substrate including a thin film transistor structure according to the present invention, and FIGS. 5A and 5B are cross sectional views along II-II' and III-III' of FIG. 4 according to the present invention. In FIG. 4, a plurality of parallel gate lines 211 and a plurality of parallel data lines 212 may be arranged on a transparent substrate in a matrix configuration, thereby defining a plurality of pixel regions. In addition, a TFT including a semiconductor layer 216, a gate electrode 220, a source electrode 226, and a drain electrode 228 may be formed at each crossing region of the gate and data lines 211 and 212. Moreover, a pixel electrode 234 electrically connected to the TFT may be disposed within one of the pixel regions defined by the gate and data lines 211 and 212.

In FIGS. 4 and 5A, the source electrode 226 and the drain electrode 228 may electrically contact the semiconductor layer 216 through first and second contact holes 222a and 222b, and the drain electrode 228 may electrically contact the pixel electrode 234 through a drain contact hole 230. In addition, the semiconductor layer 216 may be composed of polysilicon (p-Si), which may be formed by depositing an amorphous silicon (a-Si) film on the substrate and annealing the deposited amorphous silicon film using a laser.

In FIG. 4, the gate electrode 220 may extend from the gate line 211 toward the pixel region, wherein both the gate electrode 220 and the gate line may be formed of the same material and within the same plane. In addition, the gate electrode 220 may be formed to have a thickness less than a thickness of the gate line 211. Accordingly, since the gate electrode 220 and the gate line 211 may be formed having different thicknesses, an electrical open circuit condition of the semiconductor layer 216 formed on the gate electrode 220 may be prevented due to curvature of the stepped portions "B" of the gate line and gate electrode 211 and 220.

In FIG. 5A, a buffer layer 214 may be formed along an entire surface of an insulator substrate 200, and the gate electrode 220 may be formed on the buffer layer 214. Then, a gate insulating film 218 may be formed on the gate electrode 220 and the buffer layer 214, and a semiconductor layer 216 may be formed on the gate insulating film 218. The gate electrode 220 may be formed to have a thickness less than a thickness of the gate line 211 (in FIG. 4) by photolithographic processes using a diffraction mask considering a height different between the gate electrode 220 and the gate buffer layer 214.

Then, an interlayer insulating film 224 may cover the semiconductor layer 216 and may include first and second contact holes 222a and 222b. Next, source and drain electrodes 226 and 228 may be formed on the interlayer insulating film 224 and within the first and second contact holes 222a and 222b. Accordingly, the source and drain electrodes may be electrically connected to the semiconductor layer 216 through the first and second contact holes 222a and 222b.

Next, a passivation layer 232 having a drain contact hole 230 may be formed on the source and drain electrodes 226 and 228 and the interlayer insulating film 224. Then, a pixel electrode 234 may be formed on the passivation layer 232 and within the drain contact hole 230. Accordingly, the pixel electrode 234 may be electrically connected to the drain electrode 228 through the drain contact hole 230. In addition, the gate electrode 220 and the gate line 211 may be formed of the same metal material but having a different thickness by using photolithography processes using a diffraction mask.

In FIG. 5A, since the gate electrode 220 and the gate line 211 (in FIG. 4) may be formed having different thicknesses, an electrical open circuit condition of the semiconductor layer 216 formed on the gate electrode 220 may be prevented due to curvature of the stepped portions "B" of the gate line and gate electrode 211 and 220.

In FIG. 5B, the buffer layer 214 may be formed along the entire surface of the insulator substrate 200, wherein the gate electrode 220 and the gate line 211 connected with the gate electrode 220 may be formed on the buffer layer 214. The gate insulating film 218 is formed on the gate electrode 220 and the buffer layer 214, and the semiconductor layer 216 is formed on the gate insulating film 218. Accordingly, the gate electrode 220 and the gate line 211 may be formed of the same metal material on the same layer, and the gate electrode 220 may be formed having a thickness less than a thickness of the gate line 211 considering the semiconductor layer 216 formed on the gate electrode 220. Thus, the gate electrode 220 and the gate line 211 may be formed having different thicknesses by using a photolithographic process using a diffraction mask.

The interlayer insulating film 224 may be formed on the semiconductor layer 216 and the gate insulating film 218 to cover the semiconductor layer 216. Although not shown in FIG. 5B, but shown in FIG. 5A, the source and drain electrodes 226 and 228 may be formed on the interlayer insulating film 224 and within contact holes 222a and 222b.

Then, the passivation layer 232 maybe formed on the source and drain electrodes 226 and 228 and the interlayer insulating film 224, and the pixel electrode 234 may be formed on the passivation layer 232 and may be connected to the drain electrode 228. Thus, since the gate electrode 220 is formed at a thickness less than a thickness of the gate line 211, a curvature of the stepped portion "B" between the gate electrode 220 and the buffer layer 214 and a curvature of the stepped portion "B" between the gate electrode 220 and the gate line 211 may be reduced, thereby fabricating a polysilicon TFT having a good quality.

Figure 6A:
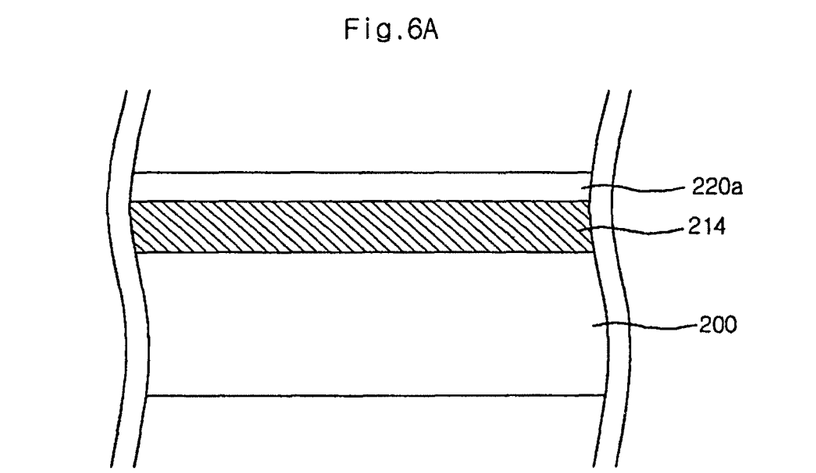
FIGS. 6A-6H are cross sectional views of an exemplary method of fabricating a thin film transistor according to the present invention.

FIGS. 6A-6H are cross sectional views of an exemplary method of fabricating a thin film transistor according to the present invention. In FIG. 6A, a buffer layer 214 and a gate metal film 220a may be sequentially deposited onto a transparent substrate 200.

Figure 6B:
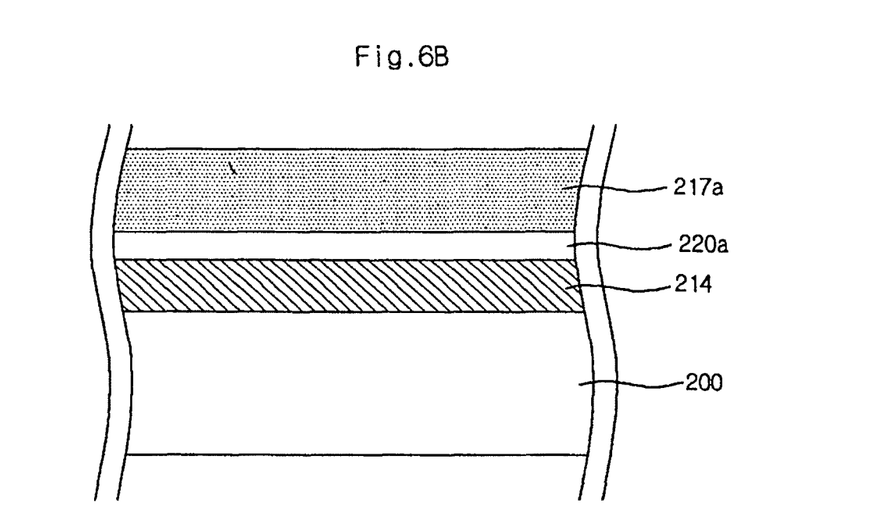

In FIG. 6B, a photoresist film 217a may be coated onto the gate metal film 220a and then diffraction-exposed using a diffraction mask. The diffraction mask may include a first portion through which light passes, a second portion having a lattice structure through which the partially light passes due to diffraction and destructive interference of the light, and a third portion that completely blocks the light.

Figure 6C:
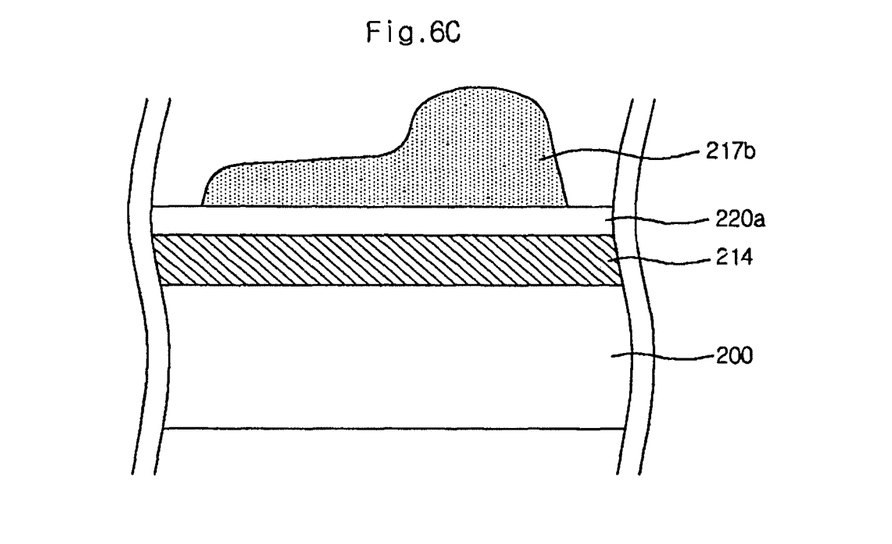

In FIG. 6C, a desired photoresist pattern 217b may be formed having a height difference between a thin gate electrode portion and a thick gate line portion formed on the gate metal pattern 220a.

Figure 6D:
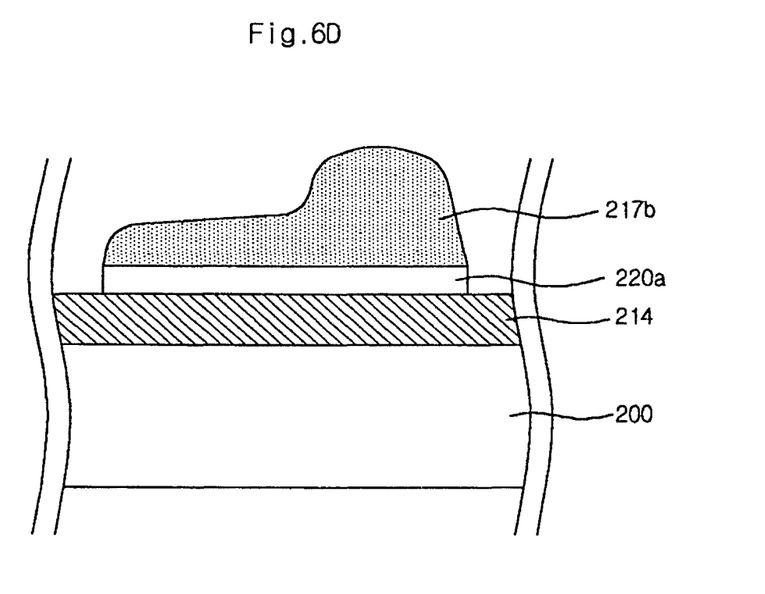

In FIG. 6D, the exposed portion of the gate metal film 220a, which is not covered with the photoresist pattern 217b, may be etched, thereby forming a gate electrode pattern (not shown) and a gate line pattern (not shown).

Figure 6E:
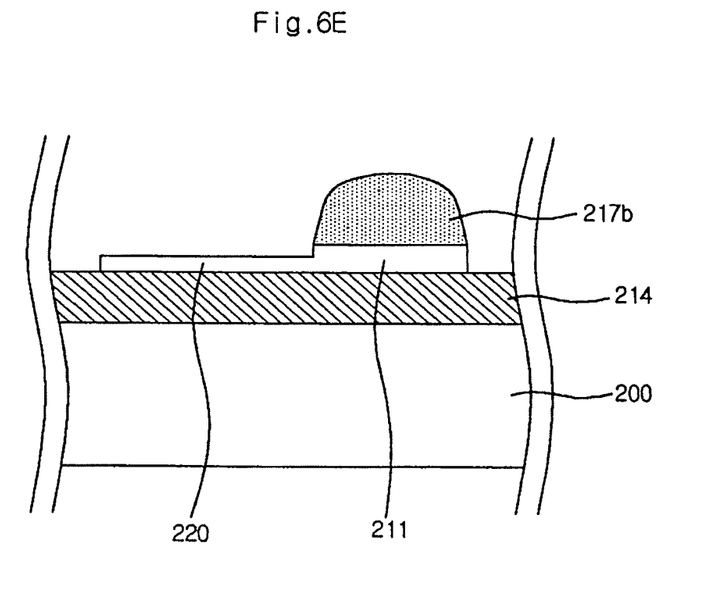

In FIG. 6E, the photoresist pattern 217b may be partially removed by an ashing process such that the photoresist pattern 217b on the gate electrode pattern (not shown) may be reduced to a thickness less than the photoresist pattern 217b on the gate line pattern (not shown). Then, the photoresist pattern 217b and the underlying gate electrode pattern and gate line pattern may be etched a second time, thereby forming the gate electrode 220 and the gate line 211.

Due to a thickness difference between the photoresist pattern 217b on the gate electrode 220 and the photoresist pattern 217b on the gate line 211, the gate electrode 220 is etched more than the gate line 211, and thus a thickness of the gate electrode 220 is reduced more than a thickness of the gate line 211.

Figure 6F:
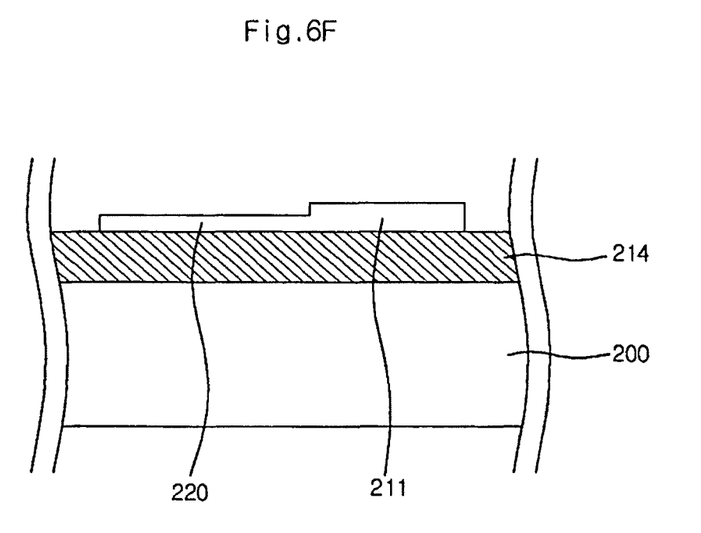

In FIG. 6F, the photoresist pattern 217b remaining on the gate line 211 may be removed, thereby forming the gate electrode 220 and the gate line 211 having different thicknesses.

Figure 6G:
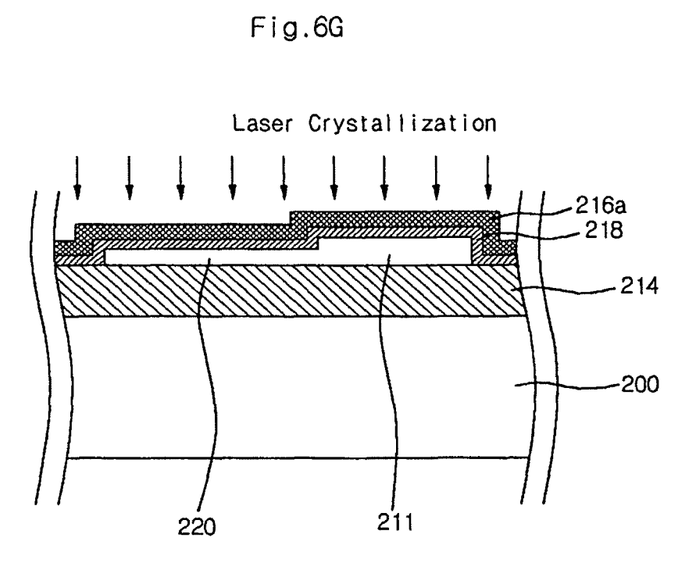
Figure 6H:
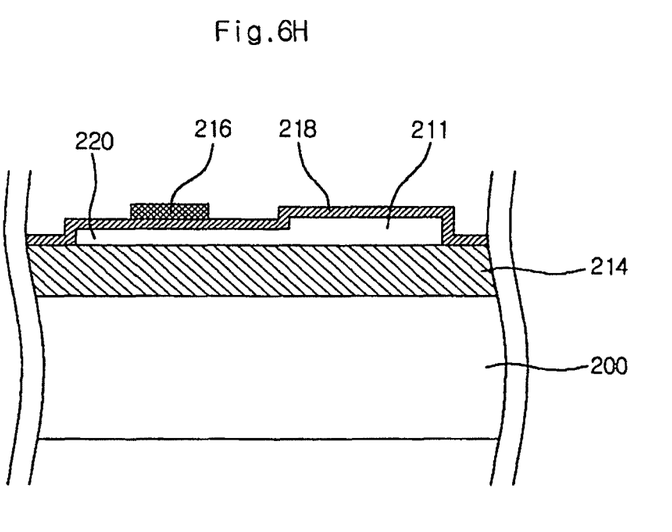

In FIG. 6G, a gate insulating film 218 may be formed on the gate electrode 220. Then, a thin amorphous silicon (a-Si) film 216a may be deposited on the gate insulating film 118 to a thickness of a few hundred Å, such as about 500 Å. Next, the amorphous silicon film 216a may undergo a dehydrogenation process. Thereafter, the dehydrogenized amorphous silicon film 216a may be annealed using a laser process, and may be crystallized to form a semiconductor layer 216 (in FIG. 6H) made of polysilicon In FIG. 6H, since the amorphous silicon film has nearly no curvature at corners of the gate electrode 220 due to the thickness of the gate electrode 220, the amorphous silicon film is crystallized without creating an opening circuit condition, so that the semiconductor layer 216 of polysilicon can be formed.

Although not shown, impurity implantation may be performed to the semiconductor layer, thereby completing a polysilicon thin film transistor with a semiconductor layer formed of a doped polysilicon. For example, a photoresist pattern may be formed on a substrate including the semiconductor layer 216, and a low concentration of ions may be implanted into a part of the semiconductor layer 216 using the photoresist pattern as a mask, thereby forming an ion implantation region with a low concentration at a surface of the semiconductor layer 216 of polysilicon.

Then, a photoresist pattern covering the low concentration ion implantation region and other portion may be formed on the substrate including the semiconductor layer 216, and a high concentration of ions may be implanted into the semiconductor layer 216 using the photoresist pattern as a mask, thereby forming an active region where the impurity ion is not doped, a heavily doped source region, a heavily doped drain region, a lightly doped source region disposed between the active region and the heavily doped source region, and a lightly doped drain (LDD) region disposed between the active region and the heavily doped drain region.

Then, the photoresist pattern may be removed, and the doped ions of the source and drain regions may be activated by a laser annealing process. Thereafter, the interlayer insulating film 224 (in FIGS. 5A and 5B) covering the semiconductor layer 216 and including first and second contact holes 222a and 222b may be formed. Source and drain electrodes 226 and 228 (in FIG. 5A) may be formed spaced apart from each other on the interlayer insulating film and within the first and second contact holes.

Then, the passivation layer 232 (in FIG. 5A) having the drain contact hole 230 (in FIG. 5A) may be formed on the source and drain electrodes. The pixel electrode 234 (in FIG. 5A) may be formed on the passivation layer 232 and in the drain contact hole, and may be electrically connected to the drain electrode through the drain contact hole.

According to the present invention, in a polysilicon thin film transistor having a bottom gate structure, a gate line and a gate electrode may be formed having different thicknesses, thereby preventing formation of an open circuit condition in an amorphous silicon layer to be used as a semiconductor layer during crystallization of the amorphous silicon due to a curvature of a stepped portion of the gate electrode. Thus, device failure may be reduced, thereby decreasing manufacturing costs and enhancing device yield.

It will be apparent to those skilled in the art that various modifications and variations can be made in the polysilicon thin film transistor device and method of fabricating a polysilicon thin film transistor device of the present invention without departing from the spirit or scope of the invention. Thus, it is intended that the present invention cover the modifications and variations of this invention provided they come within the scope of the appended claims and their equivalents.

What is claimed is:

1. A method of fabricating a polysilicon thin film transistor device, comprising:
    forming a gate metal pattern made of a single layer of a singular metal material having a stepped portion formed on a substrate, wherein either side of the stepped portion of the gate metal pattern has a different thickness;
    forming a gate insulating film on the gate metal pattern;
    forming a polysilicon semiconductor layer on the gate insulating film;
    forming an active region, lightly doped drain regions, a source region and a drain region on the polysilicon semiconductor layer by implanting an impurities;
    forming a source electrode electrically connected to the source region and forming a drain electrode electrically connected to the drain region; and
    forming a pixel electrode connected to the drain electrode,
    wherein the gate metal pattern comprises a gate electrode and a gate line,
    wherein the gate electrode and the gate line are formed of the same singular metal material in the same single layer, and
    wherein the gate electrode has a thickness less than a thickness of the gate line.

2. The method according to claim 1, further comprising forming an interlayer insulating layer having a contact hole for connecting the source region to the source electrode for connecting the drain region to the drain electrode, after the forming a polysilicon semiconductor layer.

3. The method according to claim 1, wherein the forming the gate metal pattern comprises:
    depositing the single layer of the singular gate metal material on the substrate;
    coating a photoresist film on the gate metal material;
    forming a photoresist film pattern having a stepped portion by diffraction-exposing the coated photoresist film;
    patterning the gate electrode and the gate line by a first etching of the gate metal material;
    performing a second etching of the gate electrode by etching the photoresist film pattern; and
    removing the photoresist film pattern.

4. The method according to claim 3, further comprising removing the photoresist film pattern disposed on the gate electrode by ash-treating the photoresist pattern having the stepped portion, after the patterning the gate electrode and the gate line.

5. A method of fabricating a polysilicon thin film transistor device, comprising:
    forming a gate metal on a substrate;
    forming a photoresist film pattern having a stepped portion by coating a photoresist film on the gate metal and diffraction-exposing the coated photoresist film;
    patterning a gate electrode and a gate line by a first etching of the gate metal exposed by the photoresist film pattern;
    performing a second etching of the gate electrode such that the gate electrode and the gate line have a thickness difference;
    forming a gate insulating film on the patterned gate metal;
    forming a polysilicon layer on the gate insulating film;
    forming a source electrode electrically connected to a source region of the polysilicon layer and forming a drain electrode electrically connected to a drain region on the polysilicon layer; and
    forming a pixel electrode connected to the drain electrode,
    wherein the patterned gate metal is formed of a singular metal composition in a single layer, the gate electrode having a thickness less than a thickness of the gate line.

6. The method according to claim 5, further comprising, removing the photoresist film pattern disposed on the gate electrode by ash-treating the photoresist pattern having the stepped portion, after the patterning the gate electrode and the gate line.

* * * * *